(12) United States Patent
Yantchev et al.

(10) Patent No.: US 11,165,407 B2
(45) Date of Patent: *Nov. 2, 2021

(54) SOLIDLY-MOUNTED TRANSVERSELY-EXCITED FILM BULK ACOUSTIC RESONATOR

(71) Applicant: Resonant Inc., Goleta, CA (US)

(72) Inventors: Ventsislav Yantchev, Sofia (BG); Bryant Garcia, Burlingame, CA (US); Viktor Plesski, Gorgier (CH); Soumya Yandrapalli, Lausanne (CH); Robert B. Hammond, Santa Barbara, CA (US); Patrick Turner, San Bruno, CA (US); Jesson John, Dublin, CA (US)

(73) Assignee: Resonant Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/779,306

(22) Filed: Jan. 31, 2020

(65) Prior Publication Data

US 2020/0169241 A1 May 28, 2020

Related U.S. Application Data

(63) Continuation of application No. 16/438,141, filed on Jun. 11, 2019, now Pat. No. 10,601,392, which is a
(Continued)

(51) Int. Cl.
*H03H 9/02* (2006.01)
*H03H 3/02* (2006.01)
(Continued)

(52) U.S. Cl.
CPC ......... *H03H 9/02228* (2013.01); *H03H 3/02* (2013.01); *H03H 9/02031* (2013.01);
(Continued)

(58) Field of Classification Search
CPC .. H03H 9/02228; H03H 3/04; H03H 9/02031; H03H 9/132; H03H 9/174;
(Continued)

(56) References Cited

U.S. PATENT DOCUMENTS

| 6,540,827 B1 | 4/2003 | Levy et al. |
| 7,463,118 B2 | 12/2008 | Jacobsen |

(Continued)

FOREIGN PATENT DOCUMENTS

| WO | 2016017104 A1 | 2/2016 |
| WO | 2018003273 A1 | 1/2018 |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Hafizur Rahman
(74) *Attorney, Agent, or Firm* — SoCal IP Law Group LLP; John E. Gunther

(57) ABSTRACT

Resonator devices, filter devices, and methods of fabrication are disclosed. A resonator device includes a substrate and a single-crystal piezoelectric plate having parallel front and back surfaces. An acoustic Bragg reflector is sandwiched between a surface of the substrate and the back surface of the single-crystal piezoelectric plate. An interdigital transducer (IDT) is formed on the front surface. The IDT and the single-crystal piezoelectric plate are configured such that a radio frequency signal applied to the IDT excites a shear primary acoustic mode within the single-crystal piezoelectric plate. The acoustic Bragg reflector is configured to reflect the primary shear acoustic mode over a frequency range including a resonance frequency and an anti-resonance frequency of the acoustic resonator device.

28 Claims, 13 Drawing Sheets

Related U.S. Application Data continuation-in-part of application No. 16/230,443, filed on Dec. 21, 2018, now Pat. No. 10,491,192.

(60) Provisional application No. 62/753,809, filed on Oct. 31, 2018, provisional application No. 62/818,564, filed on Mar. 14, 2019, provisional application No. 62/685,825, filed on Jun. 15, 2018, provisional application No. 62/701,363, filed on Jul. 20, 2018, provisional application No. 62/741,702, filed on Oct. 5, 2018, provisional application No. 62/748,883, filed on Oct. 22, 2018, provisional application No. 62/753,815, filed on Oct. 31, 2018.

(51) Int. Cl.
  *H03H 9/13* (2006.01)
  *H03H 9/17* (2006.01)
  *H03H 9/56* (2006.01)

(52) U.S. Cl.
  CPC .......... *H03H 9/132* (2013.01); *H03H 9/175* (2013.01); *H03H 9/176* (2013.01); *H03H 9/562* (2013.01); *H03H 9/564* (2013.01); *H03H 9/568* (2013.01); *H03H 2003/025* (2013.01)

(58) Field of Classification Search
  CPC ........ H03H 9/176; H03H 9/562; H03H 9/564; H03H 9/568; H03H 2003/023; H03H 2003/0442
  USPC .................................................. 333/192, 187
  See application file for complete search history.

(56) References Cited

U.S. PATENT DOCUMENTS

| | | | |
|---|---|---|---|
| 7,535,152 B2 | 5/2009 | Ogami et al. | |
| 7,684,109 B2 | 3/2010 | Godshalk et al. | |
| 7,868,519 B2 | 1/2011 | Umeda | |
| 7,965,015 B2 | 6/2011 | Tai et al. | |
| 8,278,802 B1 | 10/2012 | Lee et al. | |
| 8,829,766 B2 | 9/2014 | Milyutin et al. | |
| 8,932,686 B2 | 1/2015 | Hayakawa et al. | |
| 9,112,134 B2 | 8/2015 | Takahashi | |
| 9,219,466 B2 | 12/2015 | Meltaus et al. | |
| 9,276,557 B1 | 3/2016 | Nordquist et al. | |
| 9,425,765 B2 | 8/2016 | Rinaldi | |
| 9,525,398 B1 | 12/2016 | Olsson | |
| 9,780,759 B2 | 10/2017 | Kimura et al. | |
| 10,601,392 B2 * | 3/2020 | Plesski | H03H 9/176 |
| 10,819,309 B1 | 10/2020 | Turner et al. | |
| 10,868,510 B2 | 12/2020 | Yantchev et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 2002/0158714 A1 | 10/2002 | Kaitila et al. | |
| 2004/0261250 A1 | 12/2004 | Kadota et al. | |
| 2011/0109196 A1 | 5/2011 | Goto | |
| 2013/0234805 A1 | 9/2013 | Takahashi | |
| 2014/0145556 A1 | 5/2014 | Kadota | |
| 2014/0151151 A1 | 6/2014 | Reinhardt | |
| 2015/0319537 A1 | 11/2015 | Perois et al. | |
| 2015/0333730 A1 | 11/2015 | Meltaus | |
| 2016/0182009 A1 | 6/2016 | Bhattacharjee | |
| 2017/0063332 A1 | 3/2017 | Gilbert et al. | |
| 2017/0179225 A1 | 6/2017 | Kishimoto | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2019/0068164 A1 | 2/2019 | Houlden et al. | |
| 2019/0273480 A1 | 9/2019 | Lin et al. | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate Mems Resonators With High FOM of 153", 2017 IEEE 30th International Conference in Micro Electra Mechanical Systems (MEMS). Jan. 22-26, 2017. pp. 942-945.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

USPTO/ISA, International Search Report and Written Opinion for PCT Application No. PCT/2019/036433, dated Aug. 29, 2019.

ISA/USPTO, International Search Report and Written Opinion for PCT Application No. PCT/2019/058632, dated Jan. 17, 2020.

* cited by examiner

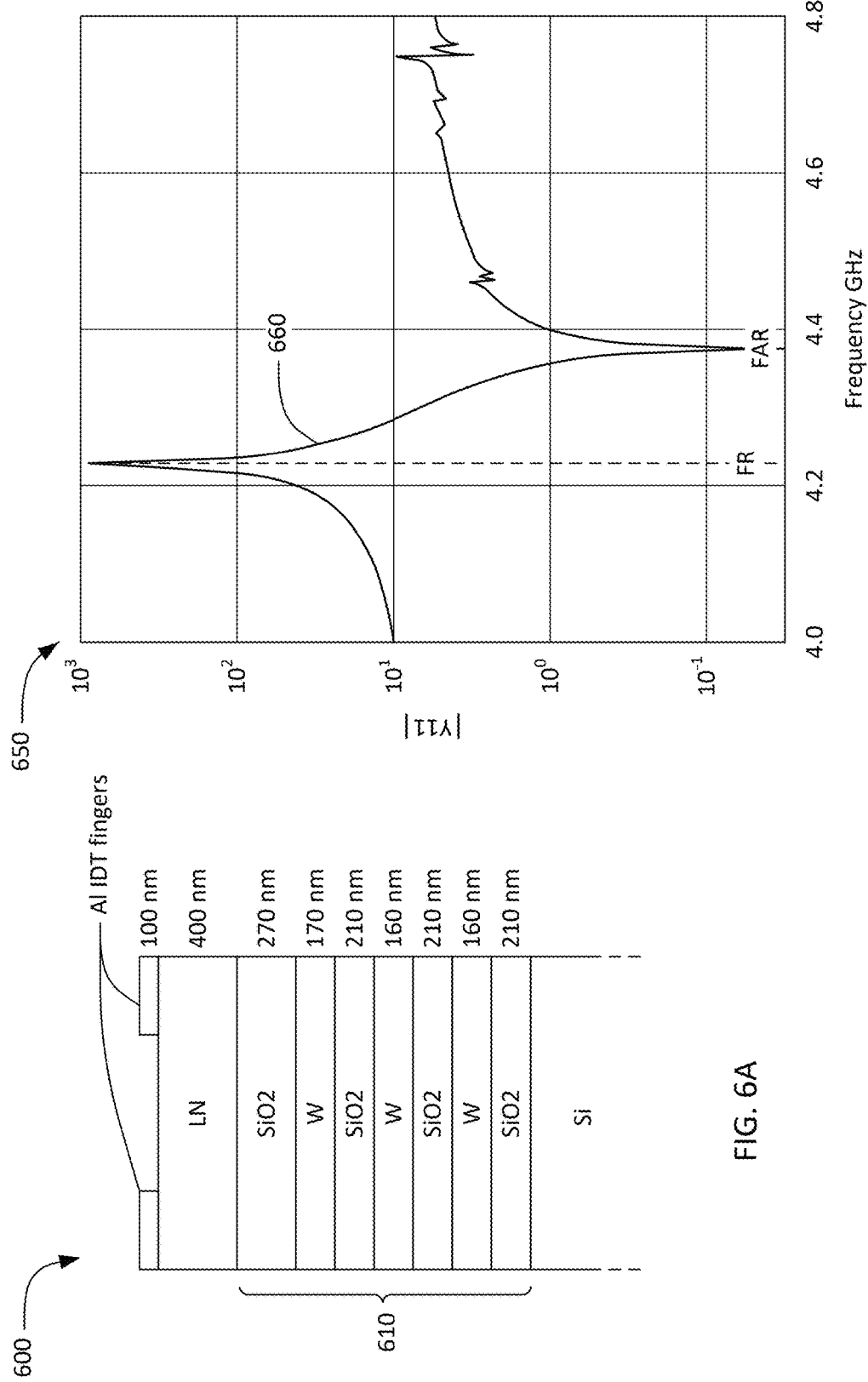

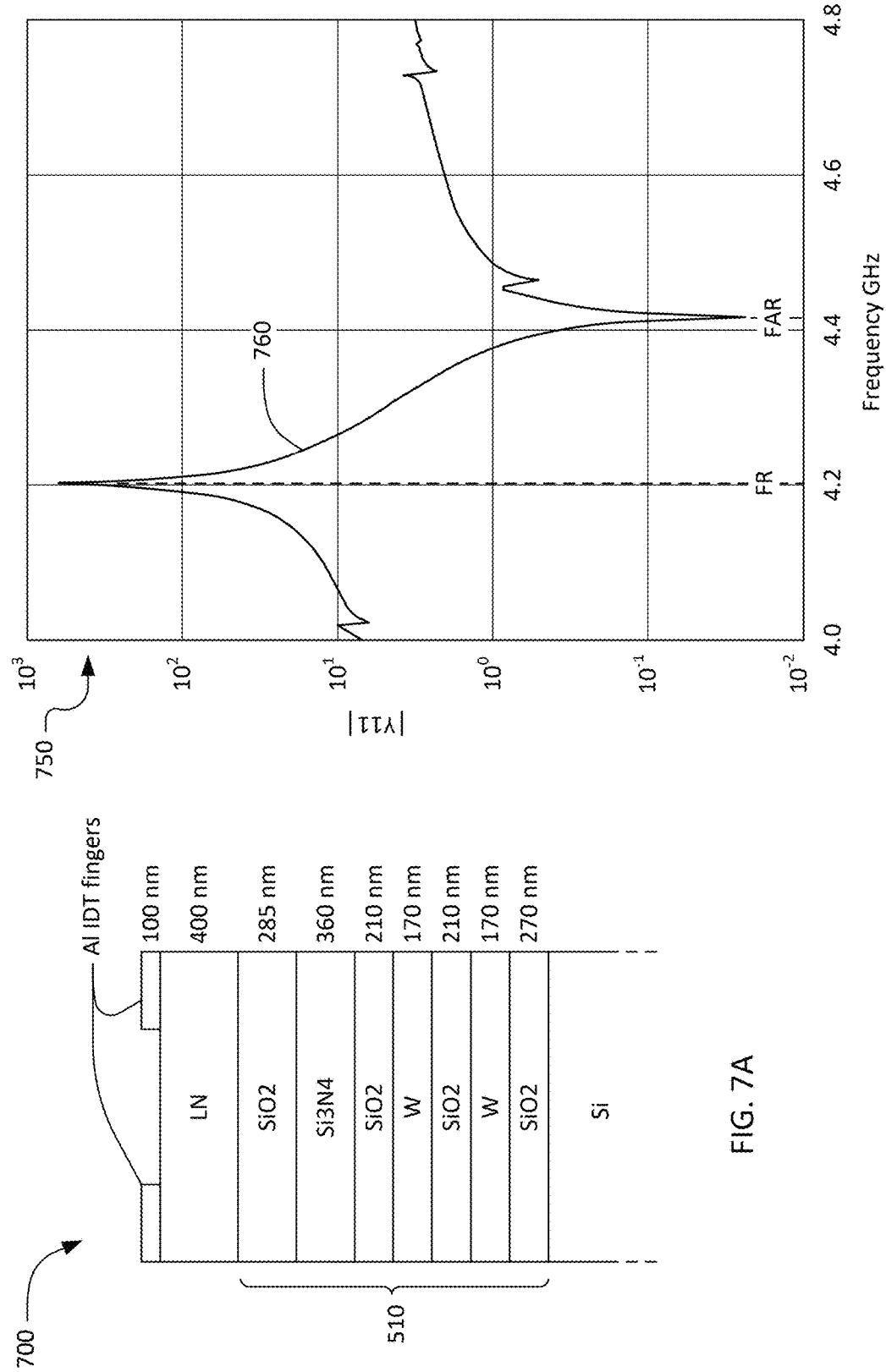

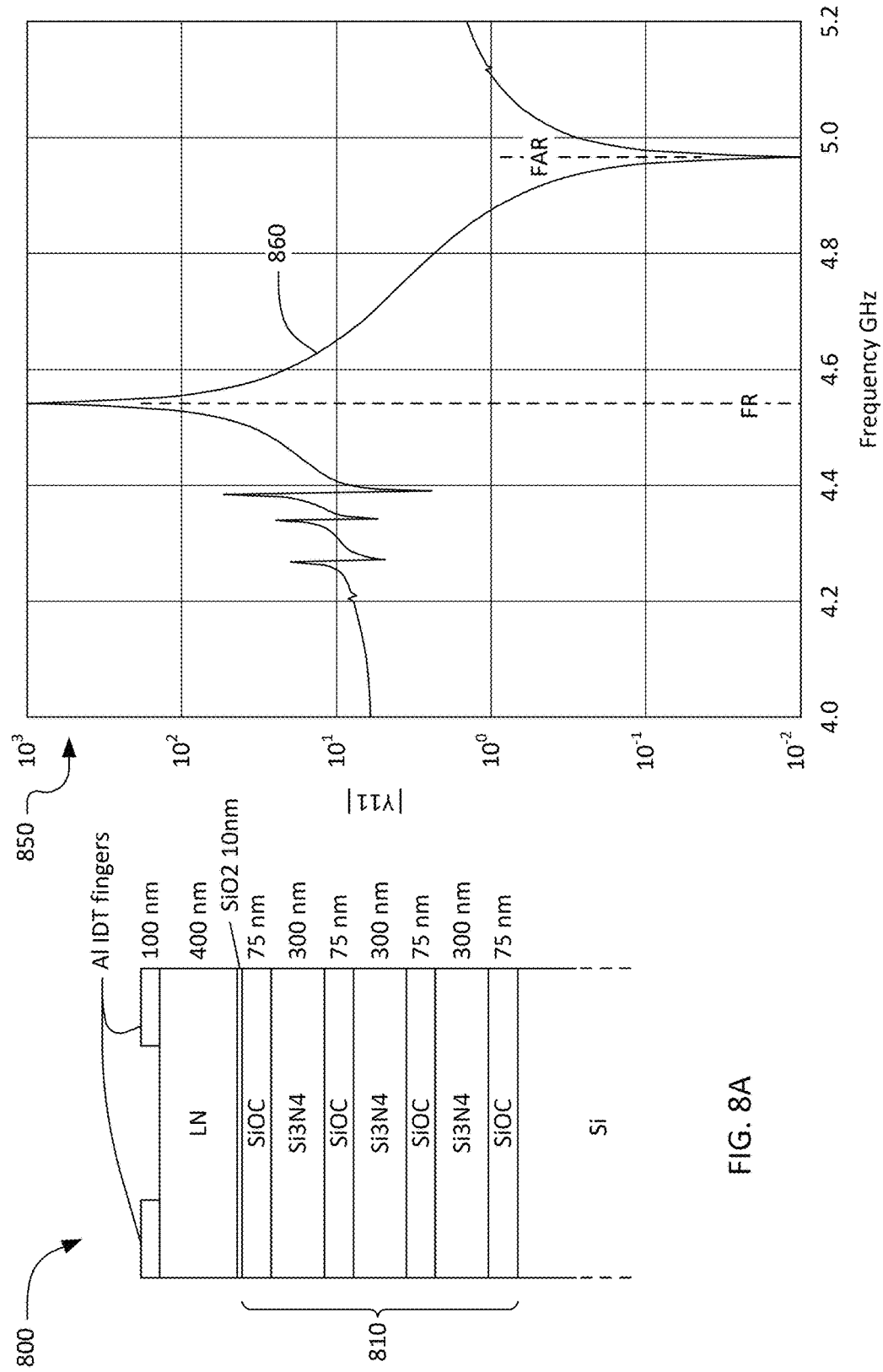

ered to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as
SOLIDLY-MOUNTED TRANSVERSELY-EXCITED FILM BULK ACOUSTIC RESONATOR

RELATED APPLICATION INFORMATION

This patent is a continuation of application Ser. No. 16/438,141, filed 11 Jun. 2019, titled SOLIDLY-MOUNTED TRANSVERSELY-EXCITED FILM BULK ACOUSTIC RESONATOR, which claims priority from provisional patent application 62/753,809, filed Oct. 31, 2018, titled SOLIDLY MOUNTED SHEAR-MODE FILM BULK ACOUSTIC RESONATOR, and provisional patent application 62/818,564, filed Mar. 14, 2019, titled SOLIDLY MOUNTED XBAR. Application Ser. No. 16/438,141 is a continuation-in-part of application Ser. No. 16/230,443, filed Dec. 21, 2018, titled TRANSVERSELY-EXCITED FILM BULK ACOUSTIC RESONATOR, now U.S. Pat. No. 10,491,192, which claims priority from the following provisional applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the insertion loss of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

DESCRIPTION OF THE DRAWINGS

FIG. 6A is an expanded schematic cross-sectional view of a portion of a second exemplary SM XBAR.

FIG. 6B is a chart of the admittance of the second exemplary SM XBAR.

FIG. 7A is an expanded schematic cross-sectional view of a portion of a third exemplary SM XBAR.

FIG. 7B is a chart of the admittance of the third exemplary SM XBAR.

FIG. 8A is an expanded schematic cross-sectional view of a portion of a fourth exemplary SM XBAR.

FIG. 8B is a chart of the admittance of the fourth exemplary SM XBAR.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
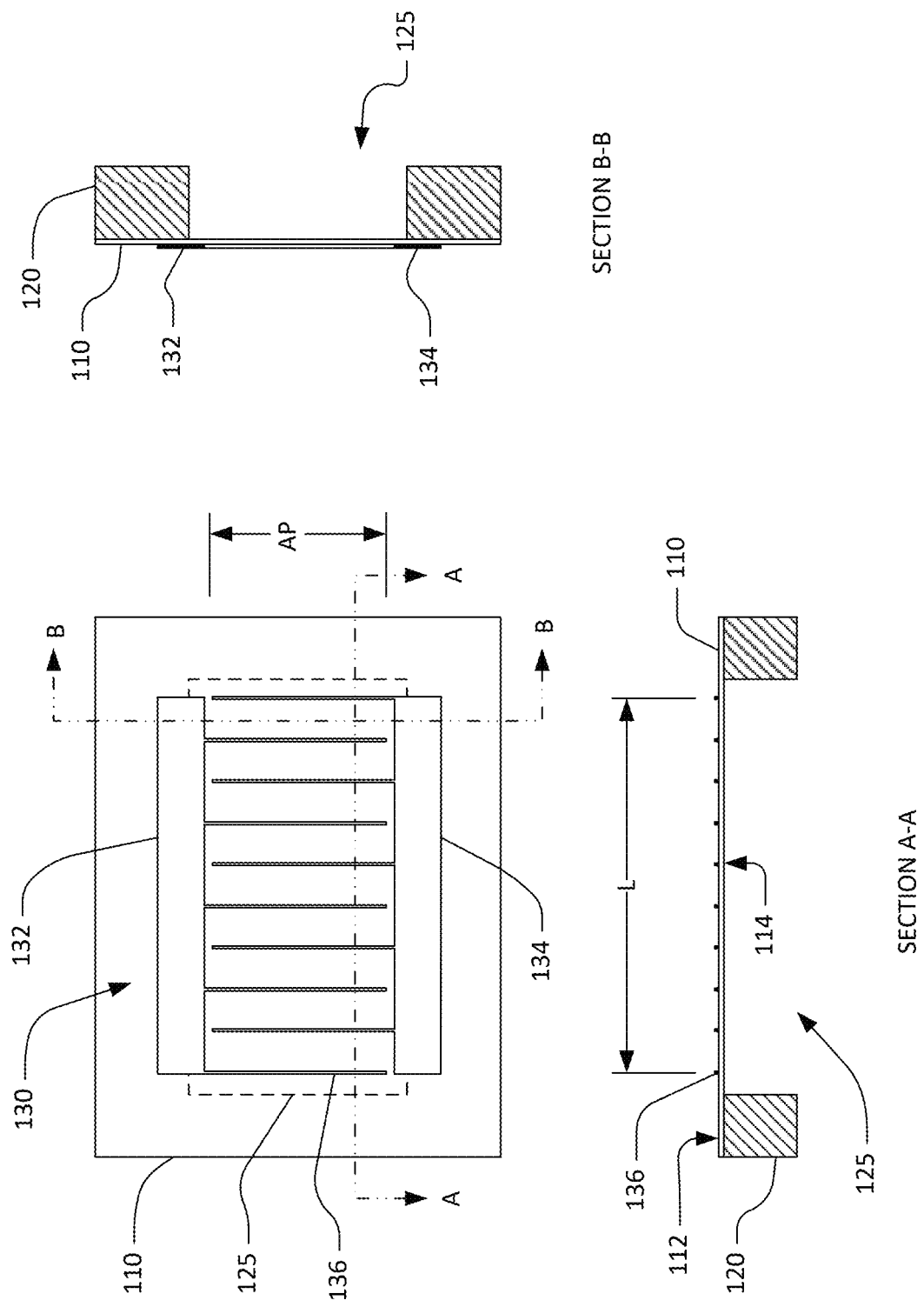
FIG. 1 includes a schematic plan view and schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100 as described in application Ser. No. 16/230,443, TRANSVERSELY-EXCITED FILM BULK ACOUSTIC RESONATOR. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

A cavity 125 is formed in the substrate 120 such that the portion of the piezoelectric plate 110 containing the IDT 130 is suspended over the cavity 125 without contacting the substrate 120. "Cavity" has its conventional meaning of "an empty space within a solid body." The cavity 125 may be a hole completely through the substrate 120 (as shown in Section A-A and Section B-B) or a recess in the substrate 120. The cavity 125 may be formed, for example, by selective etching of the substrate 120 before or after the piezoelectric plate 110 and the substrate 120 are attached. As shown in FIG. 1, the cavity 125 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
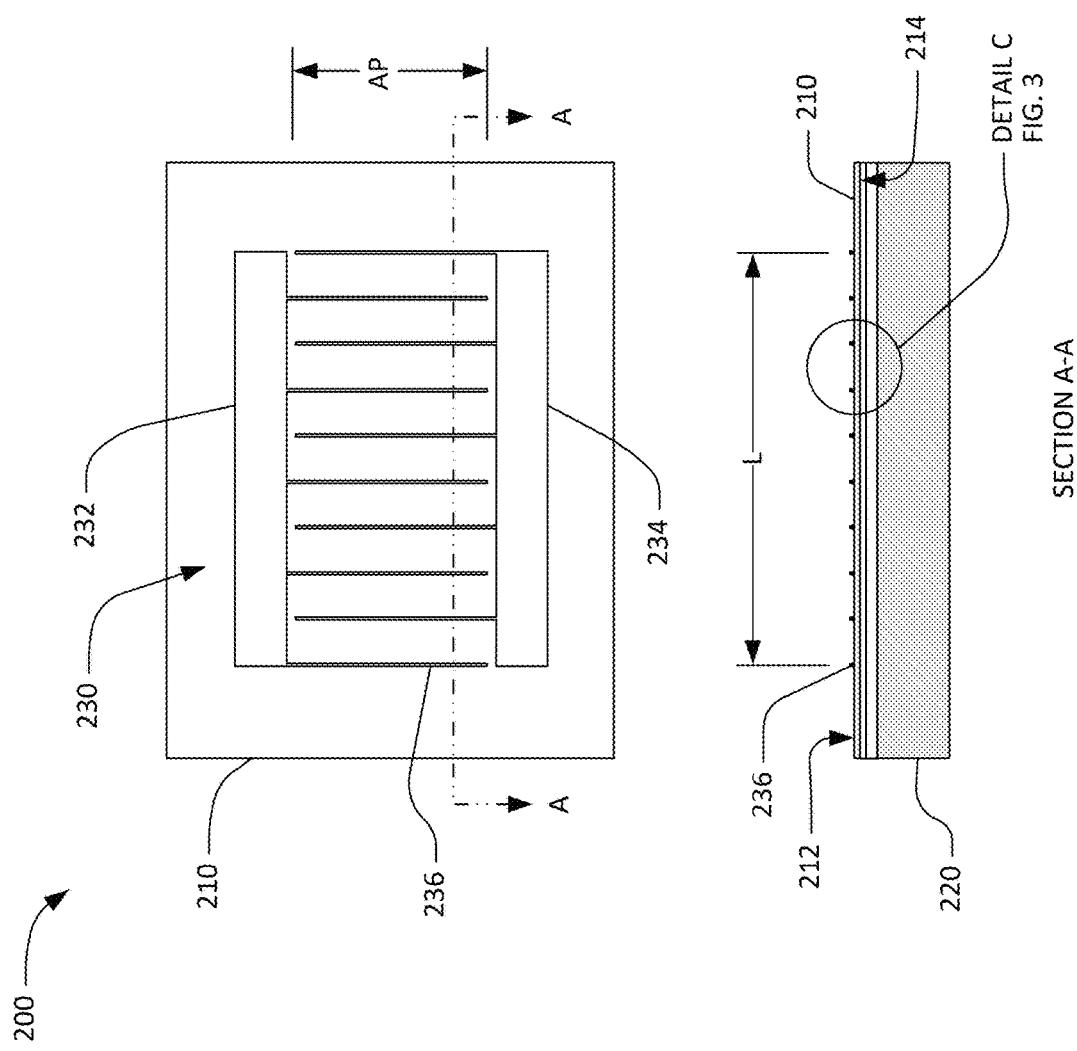
FIG. 2 includes a schematic plan view and a schematic cross-sectional view of a solidly-mounted transversely-excited film bulk acoustic resonator (SM XBAR).

FIG. 2 shows a simplified schematic top view and an orthogonal cross-sectional view of a solidly-mounted transversely-excited film bulk acoustic resonator (SM XBAR) 200. SM XBAR resonators such as the resonator 200 may be used in a variety of RF filters including band-reject filters, band-pass filters, duplexers, and multiplexers. SM XBARs are particularly suited for use in filters for communications bands with frequencies above 3 GHz.

The SM XBAR 200 is made up of a thin film conductor pattern formed on a front surface 212 of a piezoelectric plate 210 having parallel front and back surfaces 212, 214, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces of the plate. However, SM XBARs may be fabricated on piezoelectric plates with other crystallographic orientations.

The back surface 214 of the piezoelectric plate 210 is attached to, and mechanically supported by, a substrate 220. The substrate 220 may be, for example, silicon, sapphire, quartz, or some other material. As will be described subsequently, the piezoelectric plate 210 may be attached to the substrate 220 via a plurality of intermediate material layers.

The conductor pattern of the SM XBAR 200 includes an interdigital transducer (IDT) 230. The IDT 230 includes a first plurality of parallel fingers, such as finger 236, extending from a first busbar 232 and a second plurality of fingers extending from a second busbar 234. The first and second pluralities of parallel fingers are interleaved. The interleaved fingers overlap for a distance AP, commonly referred to as the "aperture" of the IDT. The center-to-center distance L between the outermost fingers of the IDT 230 is the "length" of the IDT. Each finger of the first and second pluralities of fingers may be parallel to the X axis of the piezoelectric plate 210.

The first and second busbars 232, 234 serve as the terminals of the SM XBAR 200. A radio frequency or microwave signal applied between the two busbars 232, 234 of the IDT 230 excites an acoustic wave within the piezoelectric plate 210. As will be discussed in further detail, the excited acoustic wave is a bulk shear wave that propagates in the direction normal to the surface of the piezoelectric plate 210, which is also normal, or transverse, to the direction of the electric field created by the IDT fingers. Thus, the SM XBAR is considered a transversely-excited film bulk wave resonator.

For ease of presentation in FIG. 2, the geometric pitch and width of the IDT fingers are greatly exaggerated with respect to the length (dimension L) and aperture (dimension AP) of the SM XBAR. A typical SM XBAR has more than ten parallel fingers in the IDT 210. An SM XBAR may have hundreds, possibly thousands, of parallel fingers in the IDT 210. Similarly, the thickness of the fingers in the cross-sectional views is greatly exaggerated.

Figure 3:
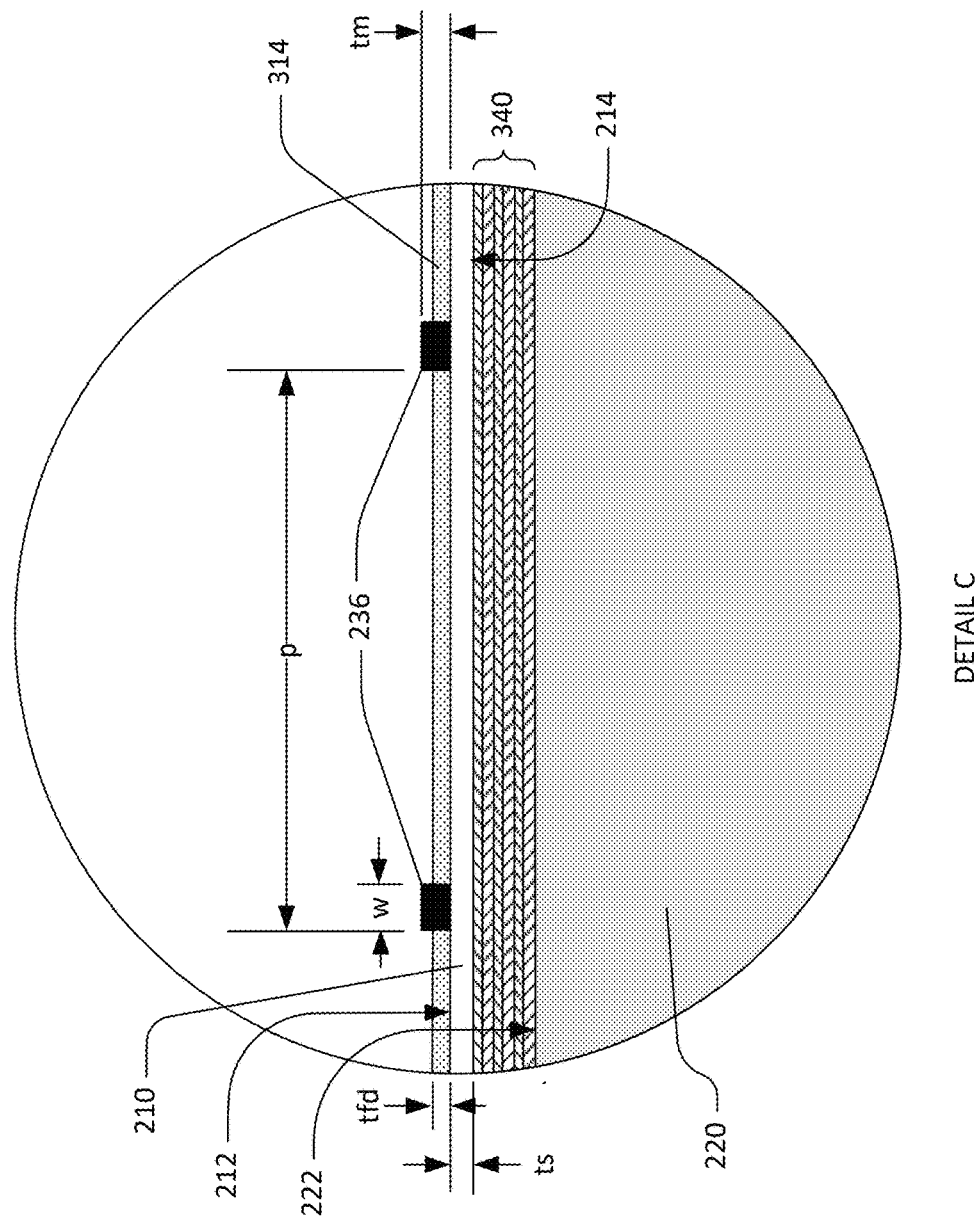
FIG. 3 is an expanded schematic cross-sectional view of a portion of the SM XBAR of FIG. 2.

FIG. 3 shows a detailed schematic cross-sectional view of the SM XBAR 200. The piezoelectric plate 210 is a single-crystal layer of piezoelectrical material having a thickness ts. ts may be, for example, 100 nm to 1500 nm. Application Ser. No. 16/230,443, TRANSVERSELY-EXCITED FILM BULK ACOUSTIC RESONATOR, includes simulation data for XBARs on piezoelectric plates having thickness from 200 nm to 1000 nm. When used in filters for LTE™ bands from 3.4 GHZ to 6 GHz (e.g. bands 42, 43, 46), the thickness ts may be, for example, 200 nm to 500 nm.

A front-side dielectric layer 314 may optionally be formed on the front surface 212 of the piezoelectric plate 210. The front-side dielectric layer 314 has a thickness tfd. The front-side dielectric layer 314 may be formed between the IDT fingers 236. Although not shown in FIG. 2, the front side dielectric layer 314 may also be deposited over the IDT fingers 236. The front-side dielectric layer 314 may be a non-piezoelectric dielectric material, such as silicon dioxide or silicon nitride. tfd may be, for example, 0 to 500 nm.

The IDT fingers 238 may be aluminum or a substantially aluminum alloy, copper or a substantially copper alloy, beryllium, gold, or some other conductive material. Thin (relative to the total thickness of the conductors) layers of other metals, such as chromium or titanium, may be formed under and/or over the fingers to improve adhesion between the fingers and the piezoelectric plate 210 and/or to passivate or encapsulate the fingers. The busbars (232, 234 in FIG. 2) of the IDT may be made of the same or different materials as the fingers.

Dimension p is the center-to-center spacing or "pitch" of the IDT fingers, which may be referred to as the pitch of the IDT and/or the pitch of the SM XBAR. Dimension w is the width or "mark" of the IDT fingers. The IDT of an SM XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width w is about one-fourth of the acoustic wavelength at resonance). In an SM XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an SM XBAR is not constrained to one-fourth of the acoustic wavelength at resonance. For example, the width of SM XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

An acoustic Bragg reflector 340 is sandwiched between a surface 222 of the substrate 220 and the back surface 214 of the piezoelectric plate 110. The term "sandwiched" means the acoustic Bragg reflector 340 is both disposed between and physically connected to a surface 222 of the substrate 220 and the back surface 214 of the piezoelectric plate 210. In some circumstances, thin layers of additional materials may be disposed between the acoustic Bragg reflector 340 and the surface 222 of the substrate 220 and/or between the Bragg reflector 340 and the back surface 214 of the piezoelectric plate 210. Such additional material layers may be present, for example, to facilitate bonding the piezoelectric plate 210, the acoustic Bragg reflector 340, and the substrate 220.

The acoustic Bragg reflector 340 includes multiple layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. Each of the layers has a thickness equal to, or about, one-fourth of the acoustic wavelength at or near a resonance frequency of the SM XBAR 200. Materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, silicon carbide, and metals such as molybdenum, tungsten, gold, and platinum. All of the high acoustic impedance layers of the acoustic Bragg reflector 340 are not necessarily the same material, and all of the low acoustic impedance layers are not necessarily the same material. In the example of FIG. 2, the acoustic Bragg reflector 340 has a total of six layers. An acoustic Bragg reflector may have more than, or less than, six layers.

Figure 4:
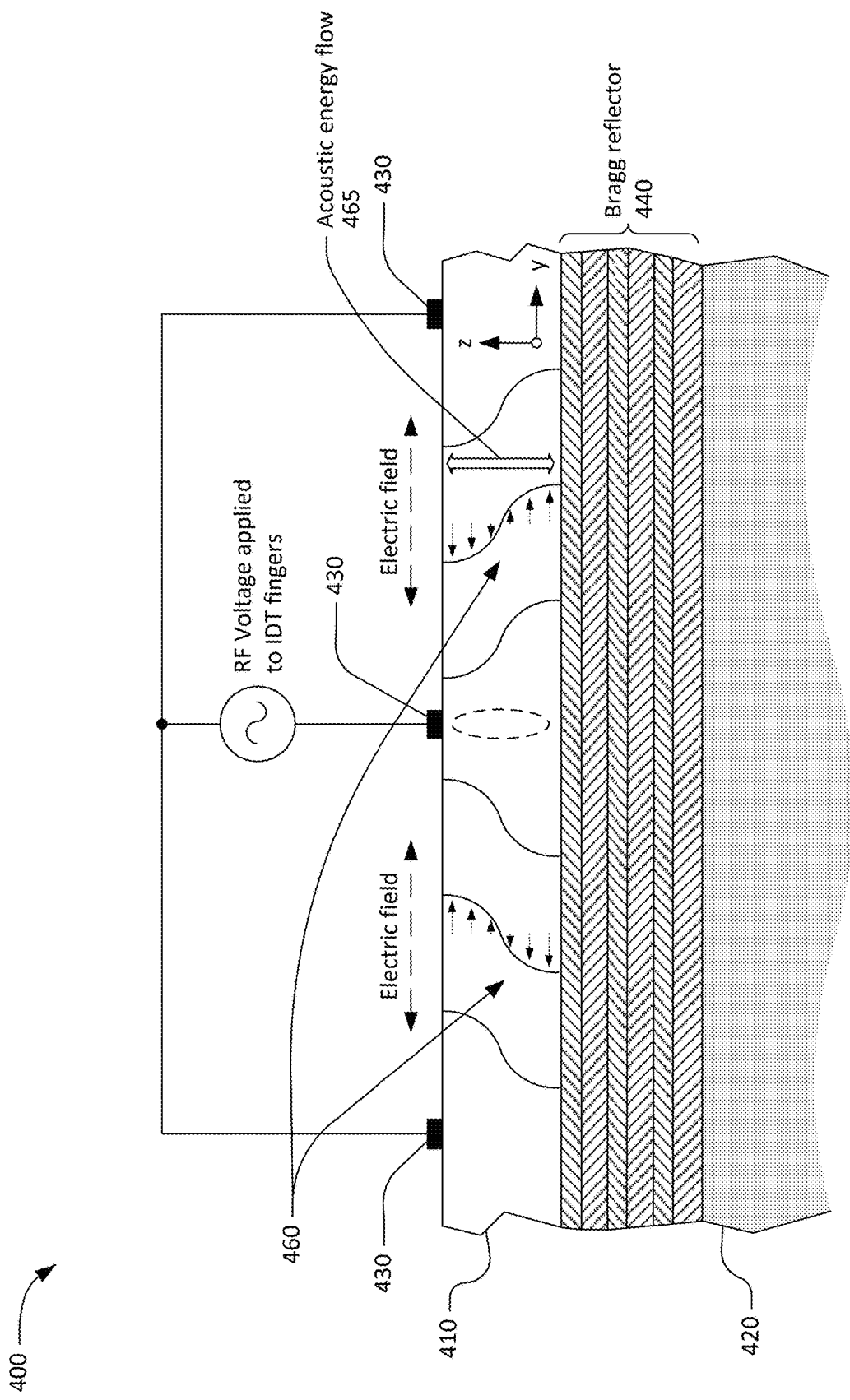
FIG. 4 is a graphic illustrating a shear horizontal acoustic mode in an SM XBAR.

FIG. 4 is a graphical illustration of the primary acoustic mode in a SM XBAR 400. FIG. 4 shows a small portion of the SM XBAR 400 including a piezoelectric plate 410 and three interleaved IDT fingers 430. The piezoelectric plate 410 may be single-crystal lithium niobate cut such that the z-axis is normal to the surfaces of the plate. The IDT fingers may be oriented parallel to the x-axis of the plate such that the y-axis is normal to the fingers.

An RF voltage applied to the interleaved fingers 430 creates a time-varying electric field between the fingers. The direction of the electric field is lateral, or parallel to the surface of the piezoelectric plate 410, and orthogonal to the length of the IDT fingers, as indicated by the dashed arrows labeled "electric field". Due to the high dielectric constant of the piezoelectric plate, the electric field is highly concentrated in the plate relative to the air. The lateral electric field introduces shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the piezoelectric plate 410 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the primary shear acoustic mode is substantially orthogonal to the surface of the piezoelectric plate, as indicated by the arrow 465.

An acoustic Bragg reflector 440 is sandwiched between the piezoelectric plate 410 and a substrate 420. The acoustic Bragg reflector 440 reflects the shear acoustic waves to keep the acoustic energy (arrow 465) predominantly confined to the piezoelectric plate 410. As previously described, the acoustic Bragg reflector 440 consists of alternating layers of materials having relatively high and relatively low acoustic impedance, with each layer having a thickness of about one-quarter of the wavelength of the shear acoustic waves (arrow 465) at resonance frequency of the XBAR 400. In the example of FIG. 4, the acoustic Bragg reflector 440 has a total of six layers. An acoustic Bragg reflector may have more than, or less than, six layers.

Example 1

Figures 5A, 5B:
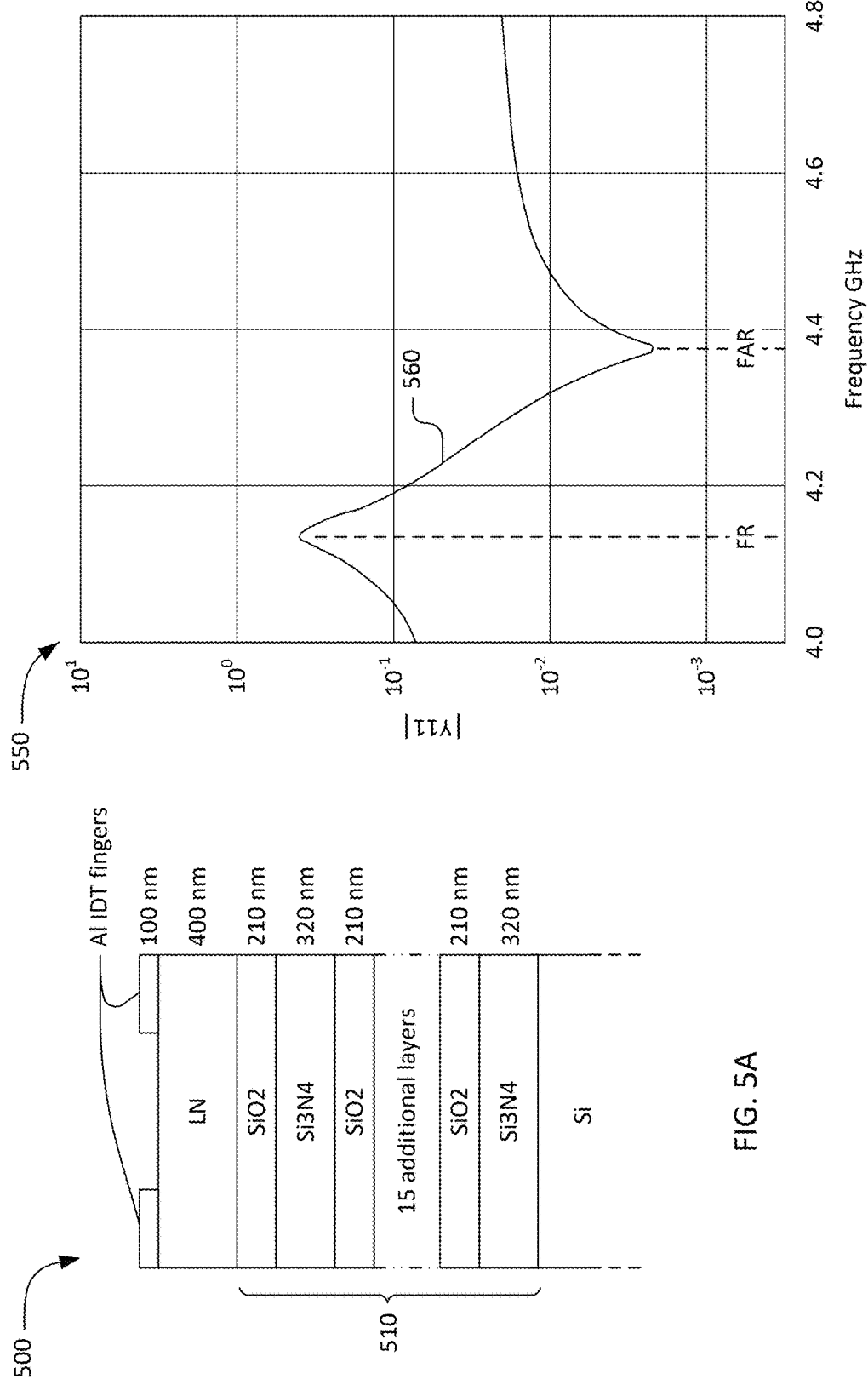
FIG. 5A is an expanded schematic cross-sectional view of a portion of a first exemplary SM XBAR.
FIG. 5B is a chart of the admittance of the first exemplary SM XBAR.

FIG. 5A is a schematic cross-sectional view of a SM XBAR 500 with an acoustic Bragg reflector 510 comprising alternating SiO2 and Si3N4 layers. The piezoelectric plate is Z-cut (i.e. Z axis normal to the surfaces of the plate) lithium niobate (LN) with a thickness of 400 nm. The IDT fingers are aluminum with a thickness of 100 nm. The pitch and width of the IDT fingers are 5 um and 500 nm, respectively. The IDT is oriented such that the IDT fingers are parallel to the X axis of the piezoelectric plate. The acoustic Bragg reflector 510 has a total of 20 layers that alternate between SiO2 layers 210 nm thick and Si3N4 layers 320 nm thick. The large number of layers in the acoustic Bragg reflector 510 is necessitated by the relatively small difference in acoustic impedance of the SiO2 and SiN3 layers. The substrate supporting the acoustic Bragg reflector 510 and the piezoelectric plate is silicon.

FIG. 5B is a chart 550 with a plot 560 of the normalized magnitude of the admittance (on a logarithmic scale) of SM XBAR 500 of FIG. 5A as a function of frequency. The data in the chart 550 and subsequent charts 650, 750, 850 was developed by simulation of SM XBAR devices using finite element method (FEM) techniques. Losses in the piezoelectric plate, acoustic Bragg reflector, and IDT fingers were simulated using standard material parameters.

The admittance plot 560 for the simulated XBAR 500 exhibits a resonance at a frequency FR of 4166 MHz and an anti-resonance at a frequency FAR of 4375 MHz. The Q at resonance and the Q at anti-resonance are both too low to be useful in a radio frequency filter. The poor performance of the SM XBAR 500 is primarily due to acoustic energy loss into the substrate. The acoustic impedance mismatch between SiO2 and Si3N4 layers is relatively small and determines low reflection coefficient per pair of layers. This in turn results in large transmission losses through the Bragg mirror even with relatively large number of pairs.

Example 2

FIG. 6A is a schematic cross-sectional view of a SM XBAR 600 with an acoustic Bragg reflector 610 comprising alternating SiO2 and tungsten (W) layers. The piezoelectric plate is Z-cut (i.e. Z axis normal to the plate) lithium niobate (LN) with a thickness of 400 nm. The IDT fingers are aluminum with a thickness of 100 nm. The pitch and width of the IDT fingers are 6 um and 1.8 um, respectively. The IDT is oriented such that the IDT fingers are parallel to the X axis of the piezoelectric plate. The acoustic Bragg reflector 610 has a total of seven layers that alternate between SiO2 layers 210 nm or 270 nm thick and W layers 160 nm or 170 nm thick. The reduced number of layers in the acoustic Bragg reflector 610 (compared to the acoustic Bragg reflector 510) is allowed by the relatively high difference in acoustic impedance of the SiO2 and W layers. The substrate is silicon.

FIG. 6B is a chart 650 with a plot 660 of the normalized magnitude of the admittance (on a logarithmic scale) of SM XBAR 600 of FIG. 6A as a function of frequency. The admittance plot 660 for the simulated XBAR 600 exhibits a high Q resonance at a frequency FR of 4225 MHz and a high Q anti-resonance at a frequency FAR of 4375 MHz. The difference between the resonance and antiresonance frequencies is 150 MHz, or about 3.5% of the resonance frequency.

The relatively small difference between the resonance and antiresonance frequencies is indicative of low electromechanical coupling in the solidly-mounted XBAR 600. The low electromechanical coupling is caused, at least in part, by the presence of the conductive W layers, which prevent the electric fields generated by the IDT electrodes from penetrating through the piezoelectric plate.

Example 3

FIG. 7A is a schematic cross-sectional view of a SM XBAR 700 with an acoustic Bragg reflector 710 comprising alternating low acoustic impedance and high acoustic impedance layers. The piezoelectric plate is Z-cut (i.e. Z axis normal to the plate) lithium niobate (LN) with a thickness of 400 nm. The IDT fingers are aluminum with a thickness of 100 nm. The pitch and width of the IDT fingers are 6 um and 1.8 um, respectively. The IDT is oriented such that the IDT fingers are parallel to the X axis of the piezoelectric plate. The acoustic Bragg reflector 710 has a total of seven layers. The low acoustic impedance layers are SiO2 210 nm, 270 nm, or 285 nm thick. The high acoustic impedance layer closest to the piezoelectric plate is Si3N4 360 nm thick. The other two high impedance layers are W 170 nm thick. The incorporation of a dielectric Si3N4 high impedance layer moves the conductive W layers 570 nm further from the IDT electrodes compared to the SM XBAR 500 of FIG. 5A. The substrate is silicon.

FIG. 7B is a chart 750 with a plot 760 of the normalized magnitude of the admittance (on a logarithmic scale) of SM XBAR 700 of FIG. 7A as a function of frequency. The admittance plot 760 for the simulated XBAR 700 exhibits a high Q resonance at a frequency FR of 4200 MHz and a high Q anti-resonance at a frequency FAR of 4416 MHz. The difference between the resonance and antiresonance frequencies is 216 MHz, or about 5.1% of the resonance frequency.

The increase (compared to the SM XBAR 600) in the difference between the resonance and antiresonance frequencies from 150 MHz to 216 MHz indicates that SM XBAR 700 of FIG. 7 has higher electromechanical coupling than the SM XBAR 600 of FIG. 6, presumably due to moving the conductive W layers further from the piezoelectric plate. A distance between the piezoelectric plate and the closest metal layer in the acoustic Bragg reflector may be used to adjust (in steps) the electromechanical coupling factor of a SM XBAR.

Example 4

FIG. 8A is a schematic cross-sectional view of a SM XBAR 800 with an acoustic Bragg reflector 810 comprising alternating low acoustic impedance and high acoustic impedance dielectric layers. The piezoelectric plate is Z-cut (i.e. Z axis normal to the plate) lithium niobate (LN) with a thickness of 400 nm. The IDT fingers are aluminum with a thickness of 100 nm. The pitch and width of the IDT fingers are 5 um and 1 um, respectively. The IDT is oriented such that the y-axis of the piezoelectric plate is normal to the IDT fingers. The acoustic Bragg reflector 810 has a total of seven layers. The low acoustic impedance layers are SiOC 75 nm thick. The high acoustic impedance layers are Si3N4 300 nm thick. The substrate is silicon. A 10 nm layer of SiO2 may be used to provide adhesion between the piezoelectric plate and the adjacent SiOC layer.

FIG. 8B is a chart 850 with a plot 860 of the normalized magnitude of the admittance (on a logarithmic scale) of SM XBAR 800 of FIG. 8A as a function of frequency. The admittance plot 860 for the simulated SM XBAR 800 exhibits a high Q resonance at a frequency FR of 4539 MHz and a high Q anti-resonance at a frequency FAR of 4965 MHz. The difference between the resonance and antiresonance frequencies is 424 MHz, or about 9.3% of the resonance frequency.

The large difference (compared to the previous examples) between the resonance and antiresonance frequencies of the SM XBAR 800 is due to the use of an all-dielectric Bragg reflector and the large difference in acoustic impedance between Si3N4 and SiOC. A similar results may be obtained using aluminum nitride for the high impedance layers in the acoustic Bragg reflector 810.

Figure 9:
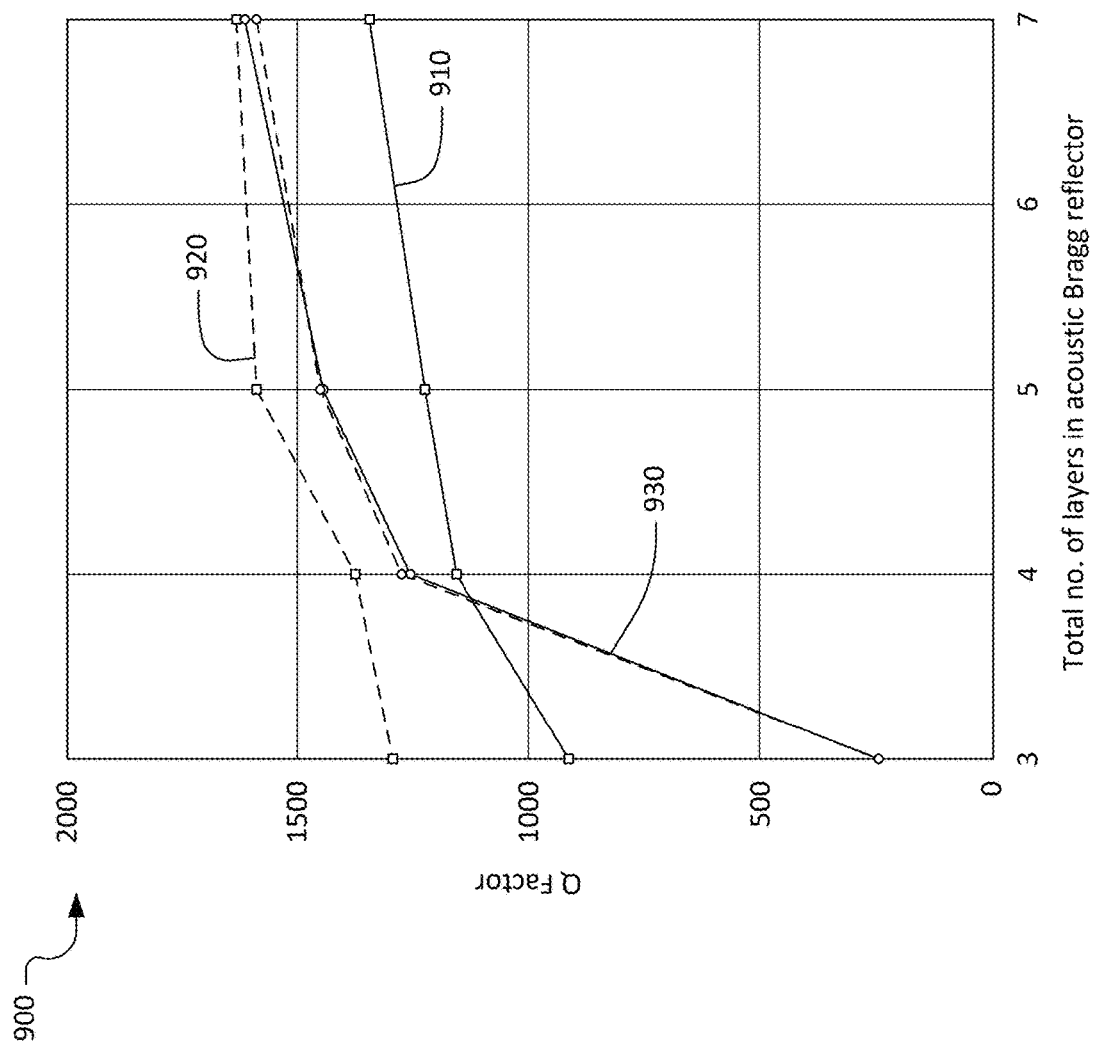
FIG. 9 is a chart showing the dependence of the Q-factor of SM XBARs on the number of layers in the acoustic Bragg reflector.

FIG. 9 is a chart showing the relationship between the Q-factor of an SM XBAR and the number of layers in the acoustic Bragg reflector. The SM XBAR is similar to the SM XBAR described in paragraph 0066, above. The solid line 910 is a plot of the Q factor at the resonance frequency for SM XBARs with Si3N4/SiOC acoustic Bragg reflectors with 3, 4, 5, and 7 total layers in the Bragg reflector. The dashed line 920 is a plot of the Q factor at the anti-resonance frequency for the SM XBARs with Si3N4/SiOC acoustic Bragg reflectors with 3, 4, 5, and 7 total layers in the Bragg reflector. The pair of lines 930 plot the Q factors at the resonance frequency (solid line) and the anti-resonance frequency (dashed line) for SM XBARs with SiO2/W acoustic Bragg reflectors with 3, 4, 5, and 7 total layers in the Bragg reflector. All of the data shown in FIG. 9 results from simulation using a finite element method. For either type of acoustic Bragg reflector, at least four total layers are required to provide Q>1000 at both the resonance and anti-resonance frequencies. Further, increasing the number of layers beyond 7 in the acoustic Bragg reflector is likely to provide further improvement in Q-factor.

Figure 10:
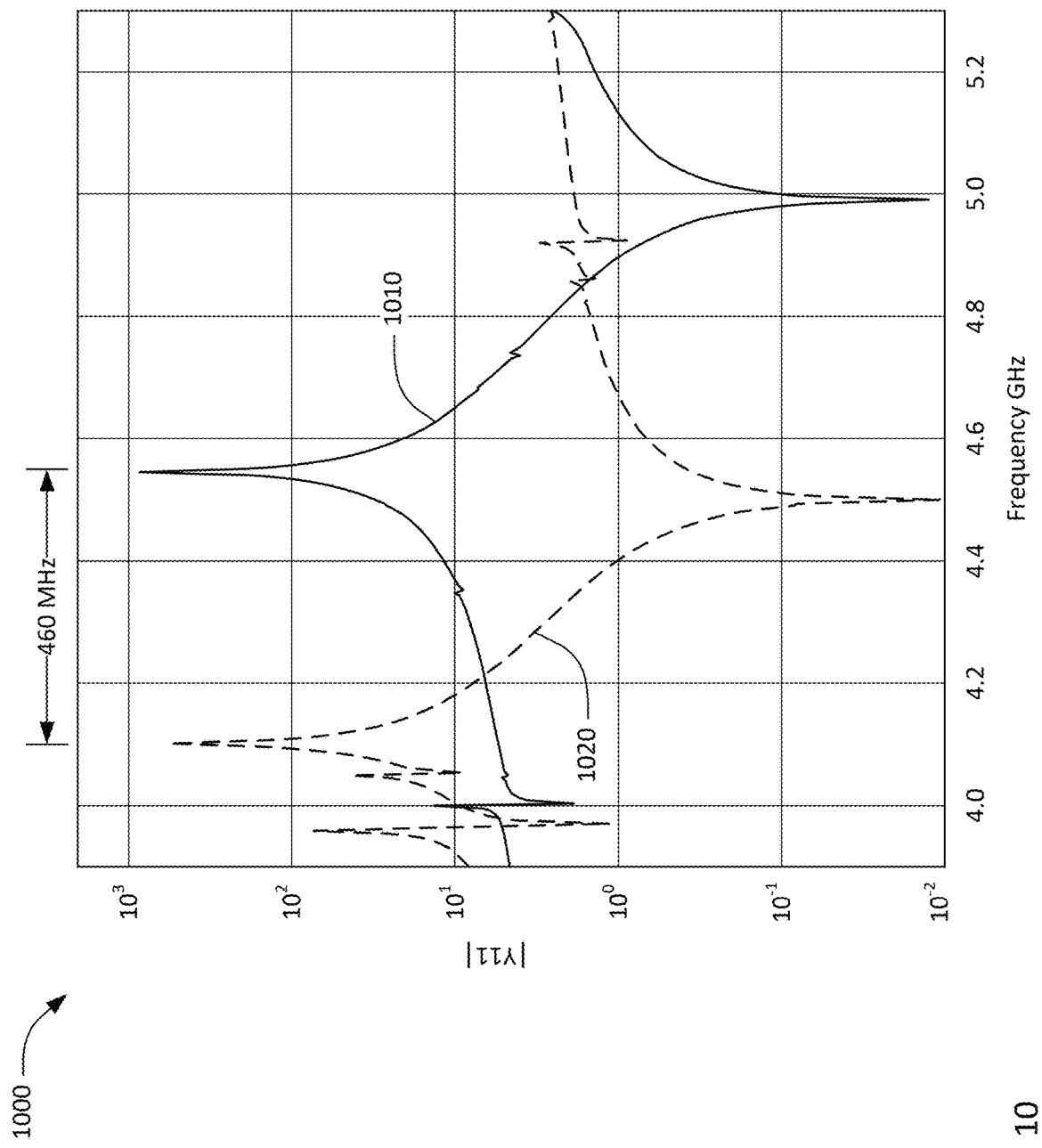
FIG. 10 is a chart comparing the admittances of two simulated SM XBARs with different dielectric layer thicknesses.

FIG. 10 is a graph 1000 comparing the admittances, as functions of frequency, of SM XBARs with and without a front-side dielectric layer. The admittance data results from simulations of SM XBAR devices using finite element method (FEM) techniques. The piezoelectric plate is Z-cut lithium niobate 400 nm thick. The IDTs have a pitch of 3.9 um and the IDT conductors are aluminum 100 nm thick.

The solid line 1010 is a plot of the admittance of an SM XBAR with tfd=0 (i.e. an SM XBAR without a dielectric layer) and IDT conductor width 1.1 um. The dashed line 1020 is a plot of the admittance of an SM XBAR with an SiO2 layer 100 nm thick and IDT conductor width of 1.0 um. The addition of the 100 nm SiO2 layer reduces the resonant frequency by about 460 MHz compared to the SM XBAR without a dielectric layer. The frequency and magnitude of the secondary resonances are affected differently than the primary shear-mode resonance.

Importantly, the same Bragg reflector structure (as shown in FIG. 8A) was used for the resonators with and without a dielectric layer.

Figure 11:
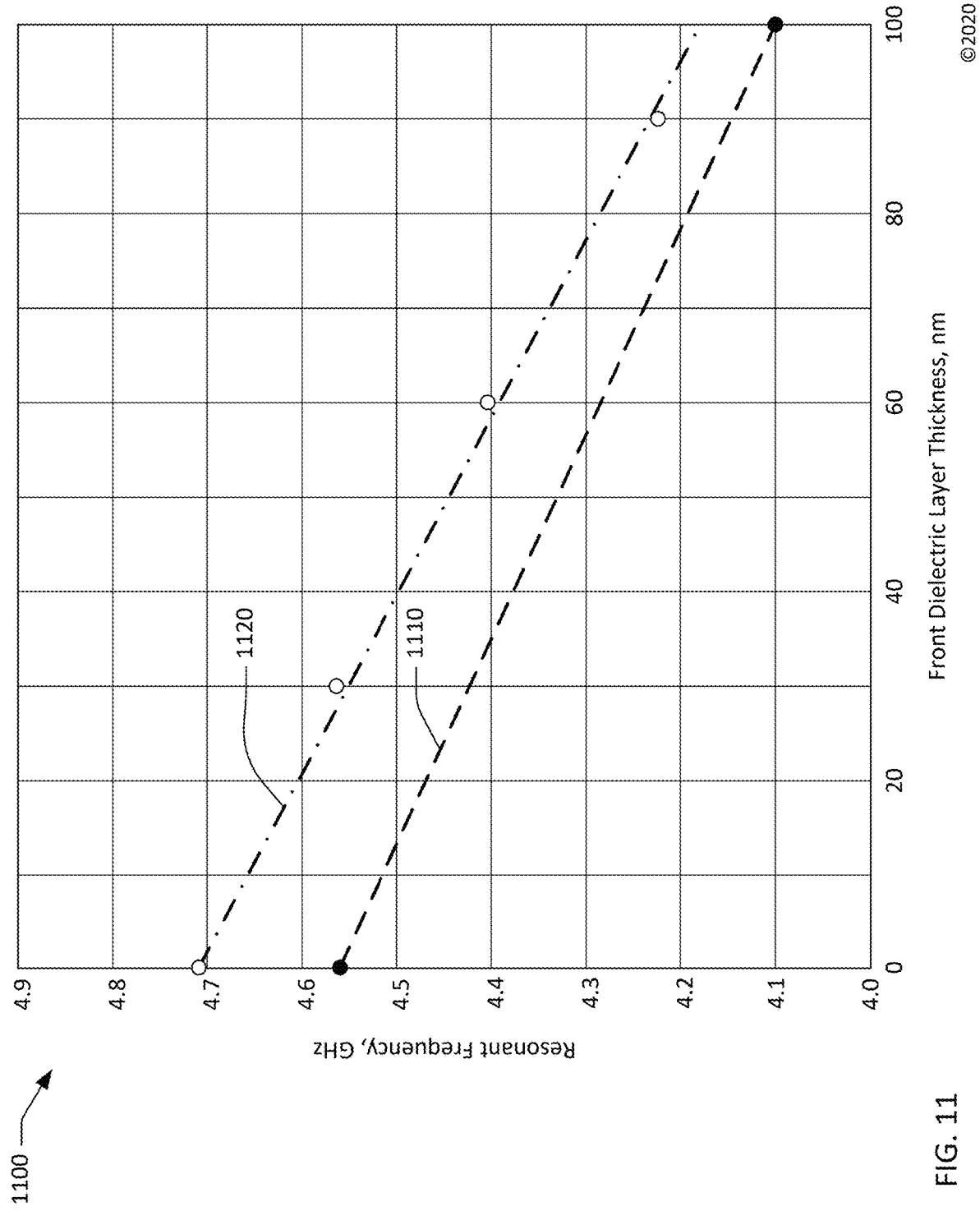
FIG. 11 is a chart comparing the admittances of simulated SM XBARS and XBARS as a function of front dielectric layer thickness.

FIG. 11 is a graph 1100 comparing the resonance frequencies of XBAR (not solidly mounted) resonators and SM XBAR resonators as functions of front-side dielectric thickness. The two solid circles represent the SM XBARS whose admittance characteristics were shown in FIG. 10. The four unfilled circles represent four XBAR devices whose admittance characteristics are shown in FIG. 7 of application Ser. No. 16/230,443. The four XBARs have the following parameter: ts=400 nm; tfd=0, 30, 60, 90 nm; tm=100 nm; p=4.2 um; w=500 nm; AP=20 um; and N (total number of IDT fingers)=51. The piezoelectric plate is Z-cut lithium niobate, the IDT conductors are aluminum, the IDTs are formed on portions of the piezoelectric plate suspended over cavities in the substrate, and the dielectric layers are SiO2.

The relationship between front-side dielectric thickness and resonance frequency for the four XBAR resonators is roughly linear, as indicated by the dot-dash line 1120. Although FIG. 11 has data for only two SM XBAR resonators, it is anticipated that the relationship between front-side dielectric thickness and resonance frequency will also be roughly linear for SM XBAR resonators, as indicated by the dashed line 1110.

Figure 12:
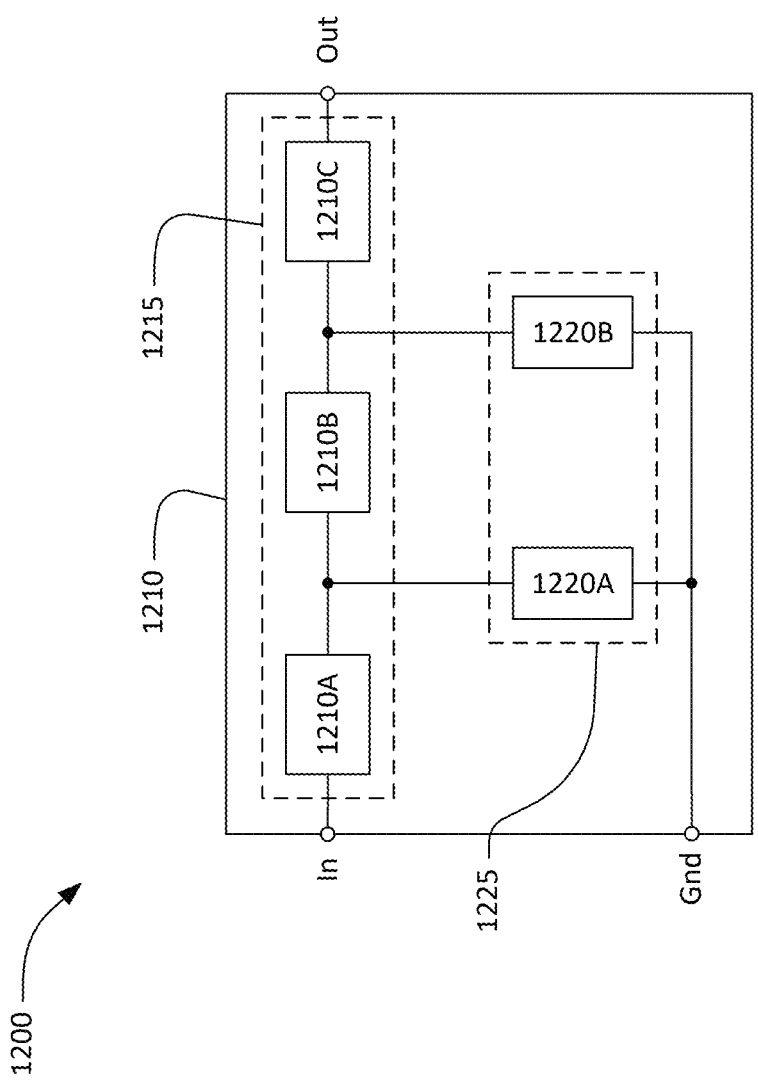
FIG. 12 is a block diagram of a filter including five SM XBARs.

FIG. 12 is a schematic circuit diagram for a high frequency band-pass filter 1200 using SM XBARs. The filter 1200 has a conventional ladder filter architecture including three series resonators 1210A, 12110B, 1210C and two shunt resonators 1220A, 1220B. The three series resonators 1210A, 1210B, and 1210C are connected in series between a first port and a second port. In FIG. 12, the first and second ports are labeled "In" and "Out", respectively. However, the filter 1200 is symmetrical and either port and serve as the input or output of the filter. The two shunt resonators 1220A, 1220B are connected from nodes between the series resonators to ground. All the shunt resonators and series resonators are SM XBARs.

The filter 1200 may include a substrate having a surface, a single-crystal piezoelectric plate having parallel front and back surfaces, and an acoustic Bragg reflector sandwiched between the surface of the substrate and the back surface of the single-crystal piezoelectric plate. The substrate, acoustic Bragg reflector, and single-crystal plates represented by the rectangle 1210 in FIG. 12. A conductor pattern formed on the front surface of the single-crystal piezoelectric plate includes interdigital transducers (IDTs) for each of the three series resonators 1210A, 12110B, 1210C and two shunt resonators 1220A, 1220B. All of the IDTs are configured to excite shear acoustic waves in the single-crystal piezoelectric plate in response to respective radio frequency signals applied to each IDT.

In a ladder filter, such as the filter 1200, the resonance frequencies of shunt resonators are typically lower than the resonance frequencies of series resonators. The resonance frequency of an SM XBAR resonator is determined, in part, by IDT pitch. IDT pitch also impacts other filter parameters including impedance and power handling capability. For broad and filter applications, it not be practical to provide the required difference between the resonance frequencies of shunt and series resonators using only differences in IDT pitch.

To reduce the resonance frequencies of some or all of the shunt resonators relative to the series resonators, a first dielectric layer (represented by the dashed rectangle 1225) having a first thickness t1 may be deposited over the IDTs of one or both of the shunt resonators 1220A, 1220B. A second dielectric layer (represented by the dashed rectangle 1215) having a second thickness t2, less than t1 may be deposited over the IDTs of the series resonators 1210A, 1210B, 1210C. The thickness of each of the first and second dielectric layers may be between 0 and 300 nm, such that 0≤t2<t1≤300 nm. The use of two different dielectric layer thicknesses may be appropriate in situations where a shift of at least 100 MHz is required between the resonance frequencies of series and shunt resonators. When the dielectric layers are silicon dioxide, t1-t2≥25 nm is sufficient to cause a shift of at least 100 MHz between the resonance frequencies of series and shunt resonators.

Description of Methods

Figure 13:
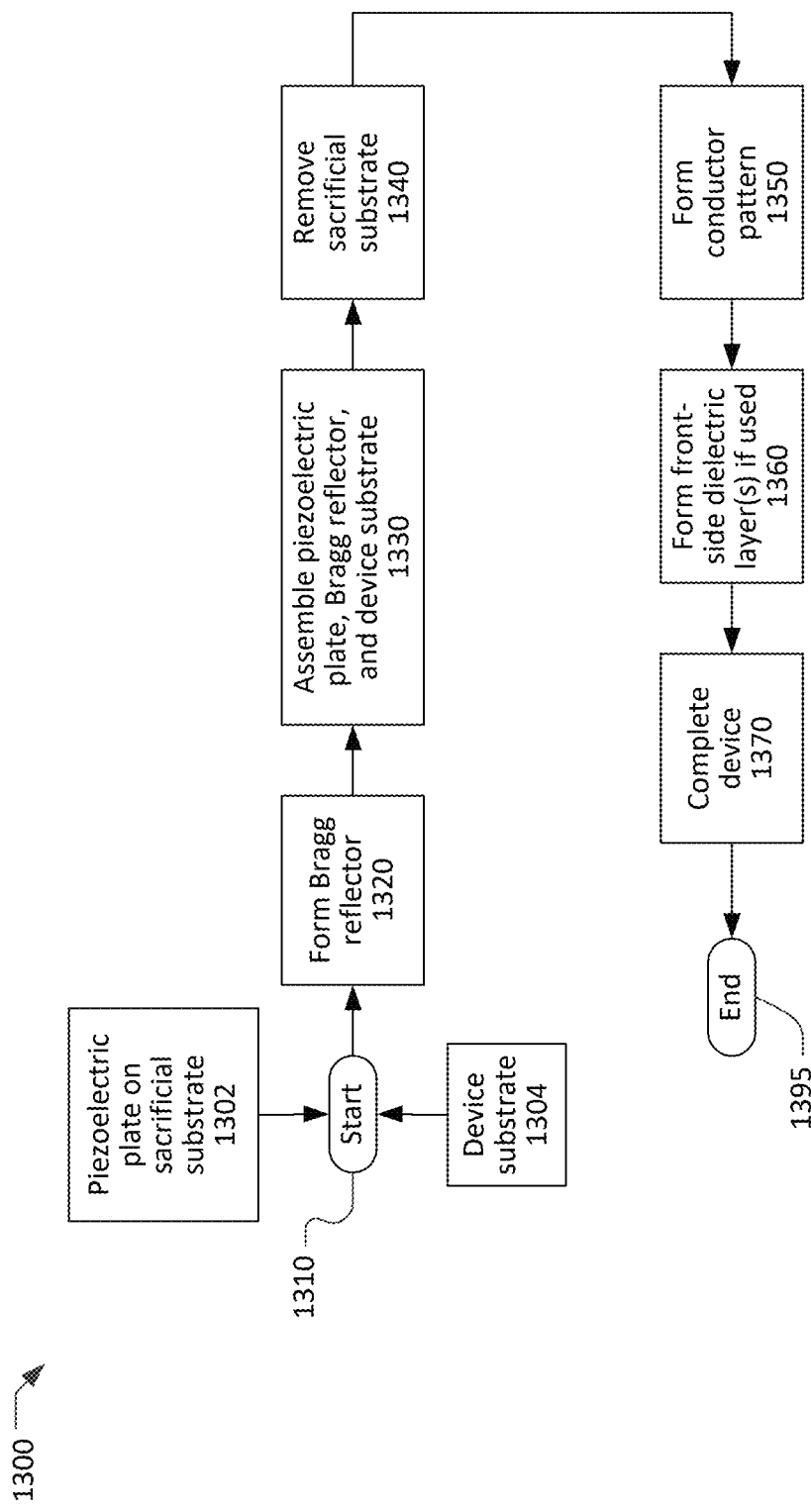
FIG. 13 is a flow chart of a process for fabricating an SM XBAR.

FIG. 13 is a simplified flow chart of a method 1300 for making a SM XBAR or a filter incorporating SM XBARs. The method 1300 starts at 1310 with a piezoelectric film disposed on a sacrificial substrate 1302 and a device substrate 1304. The method 1310 ends at 1395 with a completed SM XBAR or filter. The flow chart of FIG. 13 includes only major process steps. Various conventional process steps (e.g. surface preparation, cleaning, inspection, baking, annealing, monitoring, testing, etc.) may be performed before, between, after, and during the steps shown in FIG. 13.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. When the substrate is silicon, a layer of SiO2 may be disposed between the piezoelectric plate and the substrate. The piezoelectric plate 1302 may be, for example, z-cut lithium niobate with a thickness of 400 nm (as used in all of the previous examples) bonded to a silicon wafer with an intervening SiO2 layer. The device substrate 1304 may be silicon (as used in the previous examples) fused silica, quartz, or some other material.

At 1320 an acoustic Bragg reflector is formed by depositing alternating layers of high acoustic impedance and low acoustic impedance materials. Each of the layers has a thickness equal to or about one-fourth of the acoustic wavelength. Materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, and metals such as molybdenum, tungsten, gold, and platinum. All of the high acoustic impedance layers are not necessarily the same material, and all of the low acoustic impedance layers are not necessarily the same material. The total number of layers in the acoustic Bragg reflector may be from about five to more than twenty.

At 1320, all of the layers of the acoustic Bragg reflector may be deposited on either the surface of the piezoelectric plate on the sacrificial substrate 1302 or a surface of the device substrate 1304. Alternatively, some of the layers of the acoustic Bragg reflector may be deposited on the surface of the piezoelectric plate on the sacrificial substrate 1302 and the remaining layers of the acoustic Bragg reflector may be deposited on a surface of the device substrate 1304.

At 1330, the piezoelectric plate on the sacrificial substrate 1302 and the device substrate 1304 may be bonded such that the layers of the acoustic Bragg reflector are sandwiched between the piezoelectric plate and the device substrate. The piezoelectric plate on the sacrificial substrate 1302 and the device substrate 1304 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 1302 and the device substrate 1304 may be bonded, the sacrificial substrate, and any intervening layers, are removed at 1340 to expose the surface of the piezoelectric plate (the surface that previously faced the sacrificial substrate). The sacrificial substrate may be removed, for example, by material-dependent wet or dry etching or some other process.

A conductor pattern, including IDTs of each SM XBAR, is formed at 1350 by depositing and patterning one or more conductor layer on the surface of the piezoelectric plate that was exposed when the sacrificial substrate was removed at 1340. The conductor pattern may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1350 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1350 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1360, one or more optional front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. For example, a first dielectric layer having a first thickness t1 may be deposited over the IDTs of one or more shunt resonators. A second dielectric layer having a second thickness t2, where t2 is equal to or greater than zero and less than t1, may be deposited over the IDTs of series resonators.

After the conductor pattern and optional front-side dielectric layer are formed at 1350 and 1360, the filter device may be completed at 1370. Actions that may occur at 1370 including depositing and patterning additional metal layers to form conductors other than the IDT conductor pattern; depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1370 is to tune the resonant frequencies of the resonators within the device by adding or removing metal or dielectric material from the front side of the device. After the filter device is completed, the process ends at 1395.

A variation of the process 1300 starts with a single-crystal piezoelectric wafer at 1302 instead of a thin piezoelectric plate on a sacrificial substrate of a different material. Ions are implanted to a controlled depth beneath a surface of the piezoelectric wafer (not shown in FIG. 13). The portion of the wafer from the surface to the depth of the ion implantation is (or will become) the thin piezoelectric plate and the balance of the wafer is the sacrificial substrate. The acoustic Bragg reflector is formed at 1320 as previously described and the piezoelectric wafer and device substrate are bonded at 1330 such that the acoustic Bragg reflector is disposed between the ion-implanted surface of the piezoelectric wafer 1302 and the device substrate 1304. At 1340, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined by the energy (and thus depth) of the implanted ions. The process of ion implantation and subsequent separation of a thin plate is commonly referred to as "ion slicing".

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate having a surface;
   a single-crystal piezoelectric plate having front and back surfaces;
   an acoustic Bragg reflector sandwiched between the surface of the substrate and the back surface of the single-crystal piezoelectric plate; and
   an interdigital transducer (IDT) formed on the front surface of the single-crystal piezoelectric plate, the IDT and the single-crystal piezoelectric plate configured such that a radio frequency signal applied to the IDT excites a shear primary acoustic mode within the single-crystal piezoelectric plate,
   wherein the acoustic Bragg reflector is configured to reflect the primary shear acoustic mode over a frequency range including a resonance frequency and an anti-resonance frequency of the acoustic resonator device.

2. The device of claim 1, wherein the single-crystal piezoelectric plate is one of lithium niobate and lithium tantalate.

3. The device of claim 2, wherein
   a z-axis of the single-crystal piezoelectric plate is normal to the front and back surfaces.

4. The device of claim 3, wherein
   the IDT is oriented such that the fingers of the IDT are parallel to an x-axis of the single-crystal piezoelectric plate.

5. A method of fabricating a filter device, the method comprising:
   forming an acoustic Bragg reflector by depositing material layers on one or both of a surface of a device substrate and a first surface of a single-crystal piezoelectric plate having a second surface attached to a sacrificial substrate;

bonding the single-crystal piezoelectric plate attached to the sacrificial substrate to the device substrate such that the layers of the acoustic Bragg reflector are sandwiched between the first surface of the single-crystal piezoelectric plate and the device substrate;

removing the sacrificial substrate to expose the second surface of the single-crystal piezoelectric plate; and forming a conductor pattern on the second surface of the single-crystal piezoelectric plate, the conductor pattern including a plurality of interdigital transducers (IDTs) of a respective plurality of resonators including a shunt resonator and a series resonator;

depositing a first dielectric layer having a first thickness over the IDT of the shunt resonator; and depositing a second dielectric layer having a second thickness less than the first thickness over the IDT of the series resonator, wherein the single-crystal piezoelectric plate and all of the plurality of IDTs are configured such that respective radio frequency signals applied to the IDTs excite respective shear primary acoustic modes within the single-crystal piezoelectric plate, and wherein the acoustic Bragg reflector is configured to reflect the respective shear primary acoustic modes excited by all of the plurality of IDTs.

6. The device of claim 1, wherein the acoustic Bragg reflector comprises:
a plurality of dielectric layers alternating between high acoustic impedance layers and low acoustic impedance layers.

7. The device of claim 6, wherein
the high acoustic impedance layers are one of silicon nitride and aluminum nitride, and
the low acoustic impedance layers are silicon oxycarbide.

8. The device of claim 7 wherein the plurality of layers includes at least four layers and not more than seven layers.

9. The device of claim 1, wherein a thickness between the front and back surfaces of the single-crystal piezoelectric plate is greater than or equal to 200 nm and less than or equal to 1000 nm.

10. The device of claim 1, wherein a pitch of fingers of the IDT is greater than or equal to 2 times the thickness of the single-crystal piezoelectric plate and less than or equal to 25 times the thickness of the single-crystal piezoelectric plate.

11. The device of claim 10, wherein
the fingers of the IDT have a width, and
the pitch is greater than or equal to 2 times the width and less than or equal to 25 times the width.

12. A filter device comprising:
a substrate having a surface;
a single-crystal piezoelectric plate having parallel front and back surfaces;
an acoustic Bragg reflector sandwiched between the surface of the substrate and the back surface of the single-crystal piezoelectric plate; and
a conductor pattern formed on the front surface of the single-crystal piezoelectric plate, the conductor pattern including a plurality of interdigital transducers (IDTs) of a respective plurality of resonators including a shunt resonator and a series resonator;
a first dielectric layer having a first thickness deposited over the IDT of the shunt resonator; and
a second dielectric layer having a second thickness less than the first thickness deposited over the IDT of the series resonator, wherein
all the plurality of IDTs are configured to excite respective shear primary acoustic modes in the single-crystal piezoelectric plate in response to respective radio frequency signals applied to the IDTs, and
the acoustic Bragg reflector is configured to reflect the respective shear primary acoustic modes excited by all of the plurality of IDTs.

13. The filter device of claim 12, wherein the single-crystal piezoelectric plate is one of lithium niobate and lithium tantalate.

14. The filter device of claim 13, wherein
a z-axis of the single-crystal piezoelectric plate is normal to the front and back surfaces.

15. The filter device of claim 14, wherein
all of the plurality of IDTs are oriented such that fingers of each IDT are parallel to an x-axis of the single-crystal piezoelectric plate.

16. The filter device of claim 12, wherein the acoustic Bragg reflector is configured to reflect the primary shear acoustic modes excited by all of the plurality of IDTs.

17. The filter device of claim 16, wherein the acoustic Bragg reflector is configured to reflect the primary shear acoustic modes over a frequency range including a resonant frequency if the shunt resonator and an anti-resonance frequencies of the series resonator.

18. The filter device of claim 12, wherein the acoustic Bragg reflector comprises:
a plurality of dielectric layers alternating between high acoustic impedance layers and low acoustic impedance layers, wherein
the high acoustic impedance layers are one of silicon nitride and aluminum nitride, and
the low acoustic impedance layers are silicon oxycarbide.

19. The filter device of claim 18 wherein the plurality of layers includes at least four layers and no more than seven layers.

20. The filter device of claim 12, wherein a thickness between the front and back surfaces of the single-crystal piezoelectric plate is greater than or equal to 200 nm and less than or equal to 1000 nm.

21. The filter device of claim 12, wherein all of the plurality of IDTs have a respective pitches greater than or equal to 2 times the thickness of the single-crystal piezoelectric plate and less than or equal to 25 times the thickness of the single-crystal piezoelectric plate.

22. The filter device of claim 12, wherein
the second thickness is greater than or equal to 0, and
the first thickness is less than or equal to 300 nm.

23. The filter device of claim 12, wherein
the plurality of resonators includes two or more shunt resonators, and
the first dielectric layer is deposited over the two or more shunt resonators.

24. The filter device of claim 12, wherein
the plurality of resonators includes two or more series resonators, and
the second dielectric layer is deposited over the two or more series resonators.

25. The filter device of claim 12, wherein
a resonance frequency of the shunt resonator is set, at least in part, by the first thickness, and
a resonance frequency of the series resonator is set, at least in part, by the second thickness.

26. The filter device of claim 25, wherein
a difference between the first thickness and the second thickness is sufficient to set the resonance frequency of the shunt resonator at least 100 MHz lower than the resonance frequency of the series resonator.

27. The filter device of claim 12, wherein the first and second dielectric layers are SiO2, and
a difference between the first thickness and the second thickness is greater than or equal to 25 nm.

28. A method of fabricating an acoustic resonator device comprising:
  forming an acoustic Bragg reflector by depositing material layers on one or both of a surface of a device substrate and a first surface of a single-crystal piezoelectric plate having a second surface attached to a sacrificial substrate;
  bonding the single-crystal piezoelectric plate attached to the sacrificial substrate to the device substrate such that the layers of the acoustic Bragg reflector are sandwiched between the first surface of the single-crystal piezoelectric plate and the device substrate;
  removing the sacrificial substrate to expose the second surface of the single-crystal piezoelectric plate; and
  forming an interdigital transducer (IDT) on the second surface of the single-crystal piezoelectric plate,
  wherein the single-crystal piezoelectric plate and the IDT are configured such that a radio frequency signal applied to the IDT excites a shear primary acoustic mode within the single-crystal piezoelectric plate, and
  wherein the acoustic Bragg reflector is configured to reflect the primary shear acoustic mode.

* * * * *